(12) United States Patent
Aalund et al.

(10) Patent No.: US 9,291,678 B2
(45) Date of Patent: Mar. 22, 2016

(54) METHOD AND CONTROLLER FOR AN ELECTRIC MOTOR WITH SWITCH TESTING

(75) Inventors: Whitney M. Aalund, Fargo, ND (US); Alan K. Gilman, Fargo, ND (US); Long Wu, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 393 days.

(21) Appl. No.: 13/484,947

(22) Filed: May 31, 2012

(65) Prior Publication Data
US 2013/0320903 A1 Dec. 5, 2013

(51) Int. Cl.
| | | |
|---|---|---|
| G01R 31/02 | (2006.01) |
| G05F 3/00 | (2006.01) |
| G01R 31/34 | (2006.01) |
| H02P 29/02 | (2006.01) |
| G01R 31/42 | (2006.01) |
| H02H 7/08 | (2006.01) |
| H02H 7/122 | (2006.01) |
| G01R 31/327 | (2006.01) |
| H02H 7/085 | (2006.01) |

(52) U.S. Cl.
CPC .............. G01R 31/343 (2013.01); G01R 31/42 (2013.01); H02H 7/0838 (2013.01); H02H 7/1225 (2013.01); H02P 29/021 (2013.01); G01R 31/025 (2013.01); G01R 31/327 (2013.01); H02H 7/0852 (2013.01)

(58) Field of Classification Search
CPC . H02M 1/32; H02M 1/36; H02M 2001/0025; H02M 7/4807; H02P 31/00; H02P 29/021; G01R 31/2607; G01R 31/42; G01R 31/343; G01R 31/327; G01R 31/025; G01R 19/0092; H02H 7/0852; H02H 7/0838; H02H 7/1225
USPC ....................................... 324/762.01
See application file for complete search history.

(56) References Cited

U.S. PATENT DOCUMENTS

| | | | | |
|---|---|---|---|---|
| 4,437,050 | A * | 3/1984 | Overzet ......................... 318/798 |
| 5,170,118 | A * | 12/1992 | Schumacher ................. 324/73.1 |
| 5,491,622 | A * | 2/1996 | Carosa ........................ 363/56.02 |
| 5,646,599 | A * | 7/1997 | Adachi ......................... 340/648 |
| 6,229,278 | B1 * | 5/2001 | Garces et al. ................. 318/801 |
| 6,459,167 | B1 * | 10/2002 | Yamanashi .................... 307/9.1 |
| 2002/0008492 | A1 * | 1/2002 | Nagayama .................... 318/727 |
| 2012/0086424 | A1 * | 4/2012 | Uemura ........................ 323/304 |
| 2012/0217920 | A1 * | 8/2012 | Singh et al. ................... 318/490 |

* cited by examiner

*Primary Examiner* — Bentsu Ro
*Assistant Examiner* — Zemenay Truneh
(74) *Attorney, Agent, or Firm* — Harness, Dickey & Pierce, P.L.C.

(57) ABSTRACT

For each phase of a controller, a pair of semiconductor switches comprises a high side switch and a low side switch. A direct current voltage bus provides electrical energy to the semiconductor switches at a test voltage level less than a full operational voltage level. A measuring circuit is adapted to measure the direct current bus voltage. A data processor determines that a deficiency in a tested, related semiconductor switch is present if the measured direct current bus voltage decreases or collapses upon activation of a particular semiconductor switch in the same phase of the controller, or if other sequential test results indicate a deficiency. If the deficiency in the related semiconductor switch is present the processor may prevent the voltage supply from providing the full operational voltage to the direct current data bus to prevent damage to the motor or the controller, for example.

24 Claims, 10 Drawing Sheets

METHOD AND CONTROLLER FOR AN ELECTRIC MOTOR WITH SWITCH TESTING

FIELD OF THE INVENTION

This invention relates to a method and controller for electric motor with switch testing.

BACKGROUND OF THE INVENTION

An electric motor may feature a rotor with permanent magnets and a stator, such as an interior permanent magnet (IPM) motor or an IPM synchronous motor. In accordance with certain prior art, an inverter or motor controller comprises semiconductor switches that support the provision of alternating current outputs for one or more phases of the electric motor. The semiconductor switch may fail in an open state (i.e., discontinuity) or a closed state (i.e., short circuit) with respect to the output terminals of the semiconductor switch. During operation of the motor, if the semiconductor switch fails in either an open state or a closed state, the motor (e.g., motor speed or torque) may be difficult to control, and damage can occur to the controller, the motor, or both. Thus, there is a need for an improved method and controller for an electric motor with switch testing.

SUMMARY OF THE INVENTION

In accordance with one embodiment, a method and system is presented for testing switches in a controller for an electric motor. For each phase of a controller, a pair of semiconductor switches comprises a high side switch and a low side switch. A direct current voltage bus provides electrical energy to the semiconductor switches at a test voltage level less than a full operational voltage level. A measuring circuit (e.g., voltage sensor) is adapted to measure the direct current bus voltage. A data processor determines that a deficiency (e.g., short circuit or fault) in a tested, related semiconductor switch is present if the measured direct current bus voltage decreases or collapses upon activation of a particular semiconductor switch in the same phase of the controller, or if other sequential test results indicate a deficiency (e.g., an open circuit) in one or more semiconductor switches. If the deficiency in the related semiconductor switch is present, the data processor may prevent the voltage supply from providing the full operational voltage to the direct current data bus to prevent damage to the motor or the controller, for example.

DESCRIPTION OF THE PREFERRED EMBODIMENT

Figure 1:
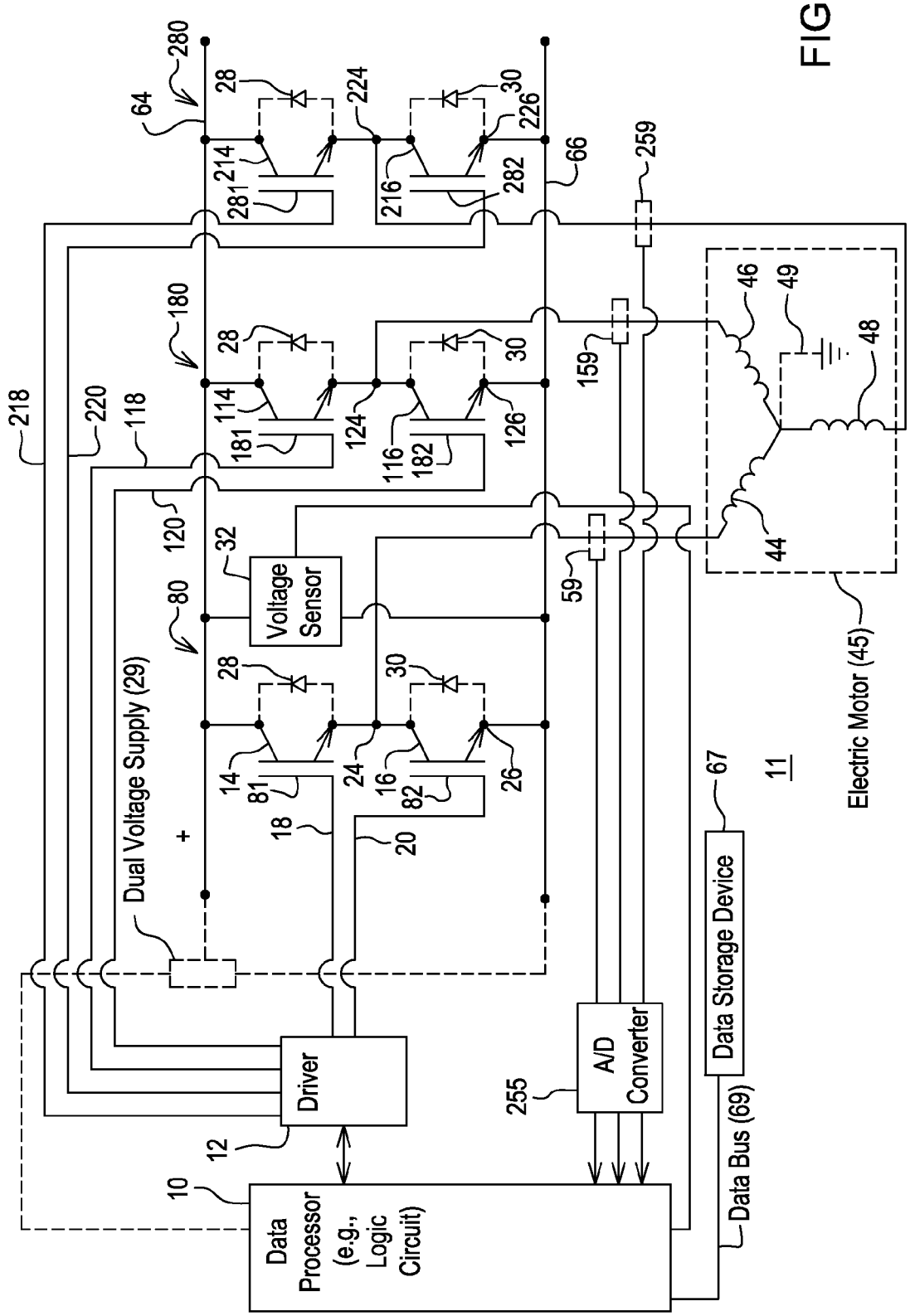
FIG. 1 is a block diagram of one embodiment of method and controller for electric motor (e.g., permanent magnet motor) with switch testing.

In accordance with one embodiment, FIG. 1 discloses a system, inverter or controller 11 for controlling an electric motor 45, where the controller 11 is capable of detection of a deficiency in one or more switches of the controller 11 in a test mode at a lower test voltage, prior to operational mode at a higher operational voltage. For example, a deficiency may comprise a short-circuit failure mode or open-circuit failure mode of one or more semiconductor devices in the controller 11. In the test mode, the lower test voltages are less likely to damage the components of the controller 11 or the motor 45 than the higher operational voltage. The electric motor 45 may comprise an interior permanent magnet (IPM) motor 45 of FIG. 1 or another alternating current machine. As illustrated, the system, aside from the motor 45, may be referred to as an inverter or a motor controller 11.

In FIG. 1, the data processor 10 is coupled to a driver 12 and a dual voltage supply 29. The driver 12 comprises a semiconductor drive circuit that drives or controls semiconductor switches (81, 82, 181, 182, 281, or 282) to generate control signals for the motor 45 coupled to an inverter circuit. The inverter circuit (80, 180 and 280) converts a direct current input signal from a direct current bus (64, 66) to one or more alternating current output signals at output terminals (24, 124, and 224). The direct current bus (64, 66) provides electric energy to the controller 11 or inverter, including its semiconductor switches. In turn, the inverter circuit (80, 180, 280) is coupled to the motor 45 or motor windings (44, 46, and 48). Although the motor windings (44, 46, and 48) are illustrated as Wye (Y) fed configuration for illustrative purposes with a central ground connection 49, other arrangements are possible and fall within the scope of the claims.

The data processor 10 provides a control signal or control data to the dual voltage supply 29 to control whether, or not, the dual voltage supply 29 operates in a test mode at a lower test voltage, prior to operational mode at a higher operational voltage. For example, upon power up or initial turn on of the controller 11, the data processor 10 may enter into a test mode or diagnostic mode by sending a control signal or control data to the dual voltage supply 29 to operate at the lower test voltage, while the data processor runs through a test program, routine, software instructions, or logic in which one or more semiconductor devices (81, 82, 181, 182, 280, 282) are selectively activated and the direct current bus voltage (e.g., the direct current voltage potential between terminals 64 and 66) is observed by the voltage sensor 32 to determine whether any deficiency exists in related semiconductor devices (e.g., 81, 82, 181, 182, 280, 282) in the same phase (e.g., for short-circuit failure modes) as the activated semiconductor device (e.g., 81, 82, 181, 182, 280, 282). However, the test mode or diagnostic mode may be programmed or scheduled to occur based on a calendar date, a number of power up or power down cycles, or control data input (e.g., contact closure or logic input) from an external device. For example, the test mode may be overridden where the motor 45 is installed on a vehicle that powers down the controller 11 at a stop light to conserve electrical energy or extend battery life.

In FIG. 1, the semiconductor switches (81, 82, 181, 182, 281, or 282) for the multiple phases (e.g., first phase 80, second phase 180 and third phase 280) collectively form an inverter circuit in which direct current inputted to the inverter circuit is inverted or transformed into one or more alternating current output signals for application to a corresponding phase or winding (44, 46, or 48) of the electric motor 45.

The inverter circuit comprises power electronics, such as switching semiconductors (81, 82, 181, 182, 281, or 282) to generate, modify and control pulse-width modulated signals or other alternating current signals (e.g., pulse, square wave, sinusoidal, or other waveforms) applied to the motor 45. An output stage of the inverter circuit provides a pulse-width modulated signal or other alternating current signal for control of the motor 45.

For each output phase (80, 180, and 280), the controller 11 or inverter comprises a pair of semiconductor switches (a first pair of 81, 82; a second pair of 181, 182; or a third pair of 281, 282). In one embodiment, the semiconductor switches (81, 82, 181, 182, 281, or 282) may comprise insulated gate bipolar transistors (IGBT), field effect transistors, power transistors, or other semiconductor devices.

First, the controller 11 or inverter comprises a first pair of semiconductor switches (81, 82) including a high side switch (81) and a low side switch (82) for a first phase 80 of the controller 11. In the first phase 80, the high side switch (81) may be referred to as a high side switch because one of its switched output terminals (e.g., collector 14 or drain, among output terminals (14, 24)) may be connected to a positive direct current terminal 64 of the direct current bus. The low side switch (82) may be referred to as a low side switch because one of its switched output terminals (e.g., emitter 26 or source, among output terminals (16, 26)) may be connected to a negative direct current terminal 66 of the direct current bus.

Second, the controller 11 or inverter comprises a second pair of semiconductor switches (181, 182) including a high side switch (181) and a low side switch (182) for a second phase (180) of the controller. In the second phase 180, the high side switch (181) may be referred to as a high side switch because one of its switched output terminals (e.g., collector 114 or drain, among output terminals (114, 124)) may be connected to a positive direct current terminal 64 of the direct current bus. The low side switch (182) may be referred to as a low side switch because one of its switched output terminals (e.g., emitter 126 or source, among output terminals (116, 126)) may be connected to a negative direct current terminal 66 of the direct current bus.

Third, the controller 11 or inverter comprises a third pair of semiconductor switches (281, 282) including a high side switch (281) and a low side switch (282) for a third phase 280 of the controller. In the third phase 280, the high side switch (281) may be referred to as a high side switch because one of its switched output terminals (e.g., collector 214 or drain, among output terminals (214, 224)) may be connected to a positive direct current terminal 64 of the direct current bus. The low side switch (282) may be referred to as a low side switch because one of its switched output terminals (e.g., emitter 226 or source, among output terminals (216, 226)) may be connected to a negative direct current terminal 66 of the direct current bus.

Figure 2:
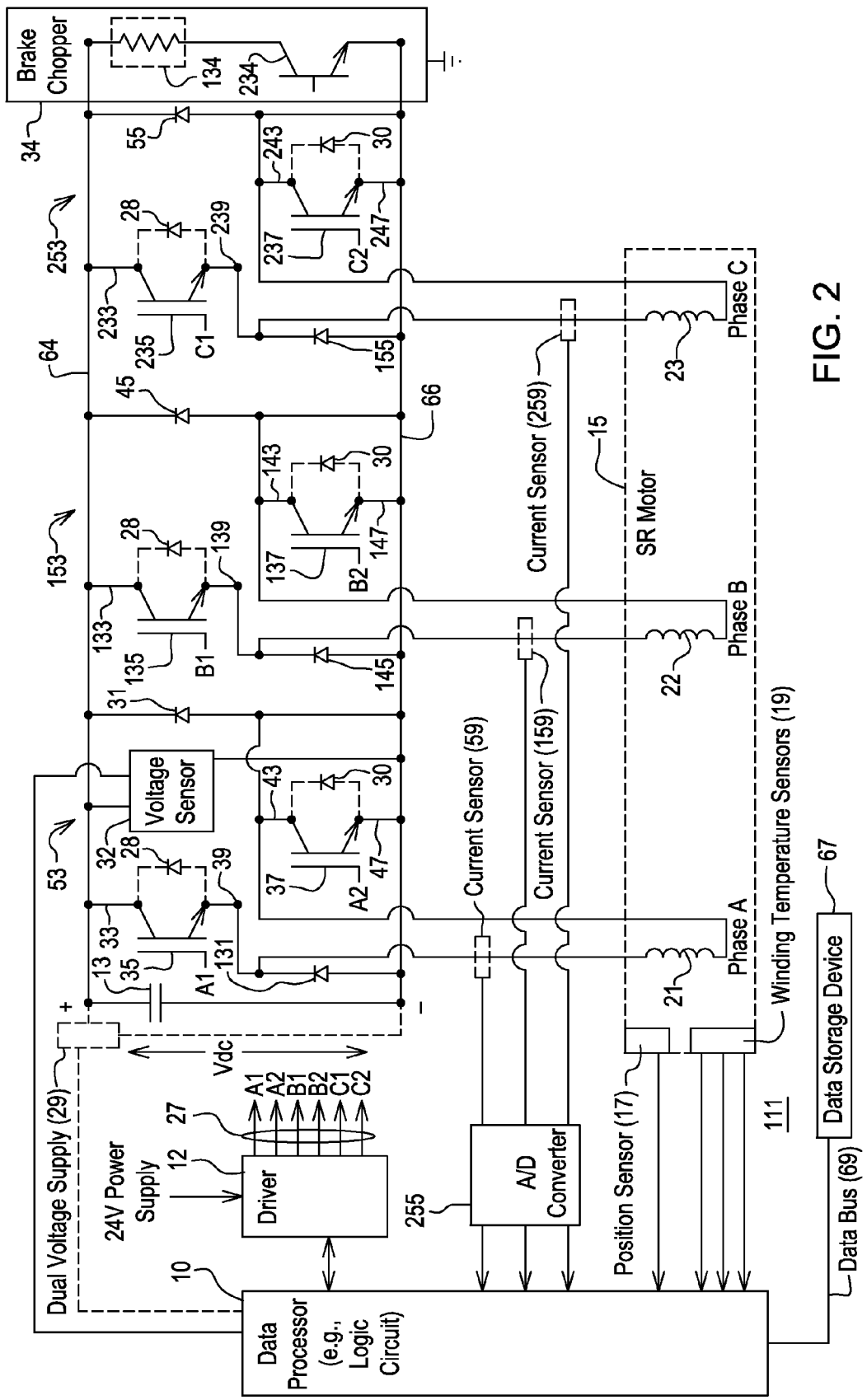
FIG. 2 is a block diagram of another embodiment of method and controller for electric motor (e.g., switched reluctance motor) with switch testing.

Although FIG. 1 and FIG. 2 each illustrate a three-phase controller for controlling an electric motor 45, a controller may generally have one or more phases and a controller with two or more phases may be used to practice any embodiment of this disclosure.

In one embodiment, the inverter circuit, inverter or controller 11 is powered by a direct current (DC) voltage bus (64, 66, collectively). For example, in FIG. 1 a direct current voltage bus (64, 66) is coupled to collector and emitter terminals or source and drain terminals of the semiconductor switches (81, 82, 181, 182, 281, or 282) for each phase. The input terminal (18, 20, 118, 120, 218, and 220) of each semiconductor switch (81, 82, 181, 182, 281, or 282) is coupled to the driver 12. The input terminal (18, 20, 118, 120, 218, and 220) of each semiconductor switch may comprise a gate or a base, for example. The output terminal (24, 124, 224) of each semiconductor switch is coupled to a terminal of a motor winding (44, 46, or 48). As illustrated in FIG. 1, the output terminal (24, 124, 224) of each phase may be located at the junction of the high side switch and the low side switch for a particular phase. Each different phase (80, 180, 280) of the motor 45 may be associated with a corresponding motor 45 winding (44, 46, or 48).

As shown in FIG. 1, a protecting diode (28, 30) may be coupled between the collector and emitter (or the source and drain) of each semiconductor switch (81, 82, 181, 182, 281, or 282) to limit the current flowing in between the collector and emitter (or output terminals) during transient states in which the semiconductor switch is deactivated or activated. The protecting diode 28 is coupled to the output terminals of the high side switches (81, 181, 281), whereas the protecting diode 30 is coupled to the output terminals of the low side switches (82, 182, 282).

A measuring circuit or voltage sensor 32 is coupled between the direct current voltage bus terminals (64, 66). In one embodiment, the voltage sensor 32 is adapted to measure the lower voltage level of the test mode, the higher level of the test mode, or both. The voltage sensor 32 can detect a material deviation or transient deviation (e.g., decrease or collapse) from the lower voltage level or direct current bus voltage that may occur when one or more semiconductor switches are activated (81, 82, 181, 182, 281, or 282) and a related switch of the same phase as the activated switch has a short circuit (e.g., as a failure mode). For example, the voltage sensor 32 may detect whether or not a voltage level of the direct current bus (e.g., between terminals 64, 66) decreases by at least a threshold level (e.g., stored in the data storage device 67) while turning on the particular switch (e.g., low side switch).

The voltage sensor 32 or measuring circuit provides a high input impedance relative to the semiconductor switch (81, 82, 181, 182, 281, or 282) and the direct current voltage bus (64, 66) such that the voltage sensor 32 or the measuring circuit does not perturb the performance of the semiconductor switch or draw material current (e.g., emitter current or collector current) from the semiconductor switch or the direct current voltage bus (64, 66). In one embodiment, the voltage sensor 32 or the measuring circuit may comprise a high impedance voltage meter or voltage sensor. For example, the measuring circuit may comprise a high impedance voltage sensor that is uses one or more operational amplifiers for comparison of an input voltage to a reference voltage. The reference voltage may be provided by a battery, a voltage regulator, or a Zener diode, for example. In one configuration, the output of the voltage sensor may be coupled to an analog-to-digital converter to provide a suitable digital input for the data processor 10.

The measuring circuit or voltage sensor 32 may provide an analog output or a digital output of the magnitude of the voltage, a polarity of the voltage, or both. As shown in FIG. 1, the voltage sensor 32 is coupled to the data processor 10 to provide a digital output thereto. If the voltage sensor 32 or measuring circuit provides an analog output, an analog-todigital converter may be interposed between the voltage sensor 32 and the inputs of the data processor 10. The measuring circuit or voltage sensor 32 is capable of detecting a decrease or collapse in the direct current voltage bus when a semiconductor switch (81, 82, 181, 182, 281, or 282) is activated or turned on. Accordingly, the measuring circuit or voltage sensor is well suited for identifying fault or short circuit in a semiconductor switch (81, 82, 181, 281, 282) or protecting diode (28, 30), such that in the test mode the current initially associated with the early detected short circuit or fault may be insufficient to damage the motor 45 or electrical machine.

In an alternate embodiment, a voltage sensor may be coupled between one terminal of the direct current bus (64, 66) and the output terminal (e.g., 24, 124, 224) of each phase to measure the magnitude and polarity of the voltage for each phase (e.g., 80, 180, 280). The polarity of the output terminal of each phase may provide an indication of which semiconductor switches (82, 181, 182, 281, or 282) are active or inactive, for example.

In some cases, the data processor 10 may lower (e.g., slightly, but with suitable bias to activate or turn on the switch) the input voltage to the gate or base input of the semiconductor switch (82, 181, 182, 281, or 282) with a greater than typical or normal leakage current to ensure the semiconductor device is operating within a desired operational zone that minimizes any fault or short circuit current in the switched output terminals of the semiconductor device.

Each phase (80, 180, 280) is associated with a current sensor (59, 159, 259), respectively. Each current sensor (59, 159, 259) measures a magnitude (e.g., root mean square current) and polarity (e.g., direction or sense) of current (e.g., alternating current) associated with an output of the controller 11. In one embodiment, a first current sensor 59 measures current associated with a first winding 44; a second current sensor 159 measures current associated with a second winding 46; a third current sensor 259 measures current associated with a third winding 48.

As shown, each current sensor (59, 159, 259) provides current data or a current signal (e.g., an analog current signal) to an analog-to-digital converter 255. In turn, the analog-to-digital converter 255 converts an analog current signal to corresponding digital current data for input to and processing by the data processor 10. For example, the data processor 10 may determine whether or not the measured magnitude of the current exceeds a target current level or threshold level that indicates a deficiency (e.g., an open circuit failure mode of a semiconductor device).

The driver 12 provides digital signals for activating the semiconductor switches (82, 181, 182, 281, or 282) in accordance with a desired input signal or control signals from the data processor 10. For example, during operation of the motor 45 in an operational mode, the input signals to the semiconductor devices of the inverter may comprise a sinusoidal signal, a square wave signal, an alternating current signal or another signal. During a diagnostic mode or a test mode, the input signals to the semiconductor devices may provide input signals or control signals to selectively activate one or more of the semiconductor switches (82, 181, 182, 281, or 282) to prevent damage to motor windings (44, 46, or 48) or permanent magnets of the motor 45.

In one embodiment, the data processor 10 may comprise an electronic data processor, a microprocessor, a microcontroller, a programmable logic array, a field programmable gate array, a logic circuit, an arithmetic logic unit, an application specific integrated circuit, a digital signal processor, a proportional-integral-derivative (PID) controller, or another data processing device. Further, the data processor 10 may be coupled to a data storage device 67 via a data bus 69.

The data storage device 67 may comprise electronic memory, nonvolatile random access memory, an optical storage device, a magnetic storage device, a hard disk drive, an optical disc drive, or another device for storing digital data or analog data. The data storage device 67 may store a look-up table, data base, file, inverted file, or another data structure with voltage threshold levels, voltage ranges, or material voltage decreases for the direct current bus voltage level that indicate a short circuit failure mode or fault in a semiconductor switch (82, 181, 182, 281, or 282). The data storage device 67 may store a look-up table, data base, file, inverted file, or another data structure with current threshold levels, current ranges, for each winding that indicate an open circuit failure mode or a short circuit failure mode in a semiconductor switch (82, 181, 182, 281, or 282).

FIG. 2 illustrates an alternative embodiment of a controller 111 or inverter with fault detection for controlling an electric motor 15. For example, the controller 111 or inverter of FIG. 2 is well suited for controlling a switched reluctance motor 15. The controller 111 or inverter of FIG. 2 is different from FIG. 1 because of various modifications that facilitate control of a switched reluctance motor 15. For example, the inverter circuit (53, 153 and 253 collectively) of FIG. 2 features additional diodes (31, 45, 55, 131, 145, 155) and does not have an output that is formed by connection of the output terminals of a low side semiconductor switch and a high side semiconductor switch. Further, the controller 111 of FIG. 2 has a rotor or shaft position sensor 17, and one or more winding temperature sensors 19, among other things. Like reference numbers in FIG. 1 and FIG. 2 indicate like elements.

In FIG. 2, the data processor 10 is coupled to a driver 12. The driver 12 comprises a semiconductor drive circuit that drives or controls switching semiconductors (35, 37, 135, 137, 235, 237) to generate control signals for each phase (e.g., 53, 153, 253) of an inverter circuit. As illustrated, the inverter circuit comprises the circuitry and semiconductor switches (35, 37, 135, 137, 235, 237) associated with a first phase 53 ("Phase A"), a second phase 153 ("Phase B") and a third phase 253 ("Phase C"). Current sensors (59, 159, and 259) are capable of measuring the current (e.g., root mean squared current, the current magnitude, and the current polarity) for each phase (53, 153, and 253). The inverter circuit converts a direct current input signal from a direct current bus (64, 66 collectively) to one or more alternating current output signals for output at output terminals (39, 43, 139, 143, 239, and 243). In turn, the inverter circuit is coupled to the motor 15 or motor windings (21, 22 and 23). The controller 111 of FIG. 2 comprises a controller for a switched reluctance motor 15 with three separate windings (21, 22, and 23) for three corresponding phases: Phase A, Phase B and Phase C.

In FIG. 2, the semiconductor switches (35, 37, 135, 137, 235, 237), protecting diodes (28, 30), supplemental diodes (31, 45, 55, 131, 145, 155), and voltage sensor 32 for the multiple phases (53, 153, 253) collectively form an inverter circuit in which direct current voltage inputted to the inverter circuit is inverted or transformed into one or more alternating current output signals for application to a corresponding phase or winding (21, 22, or 23) of the electric motor 15. The inverter circuit comprises power electronics, such as switching semiconductors (35, 37, 135, 137, 235, 237) to generate, modify and control pulse-width modulated signals or other alternating current signals (e.g., pulse, square wave, sinusoidal, alternating current, or other waveforms) applied to the motor 15. An output stage of the inverter circuit provides a pulse-width modulated signal or other alternating current signal for control of the motor 15.

For each output phase (53, 153, 253) the controller 111 or inverter comprises a pair of semiconductor switches (e.g., a first pair 35, 37; a second pair 135, 137, and a third pair 235, 237). Each semiconductor switch (35, 37, 135, 137, 235, 237) may comprise an insulated gate bipolar transistor (IGBT), a field effect transistor, a power transistor, or another semiconductor device.

First, in the first phase 53 ("Phase A") the controller 111 or inverter comprises a first pair of semiconductor switches (35, 37) including a high side switch 35, with its output terminals (33, 39) coupled in series with a low side diode 131, and a low side switch 37, with its output terminals (43, 47) coupled in series with a high side diode 31, for the first phase 53 of the controller 111. For the first phase 53, a high side semiconductor switch 35 has its output terminals (33, 39) coupled in parallel with a protecting diode 28, whereas a low side semiconductor switch 37 has its output terminals (43, 47) coupled in parallel with a protecting diode 30.

Second, in the second phase 153 ("Phase B") the controller 111 or inverter comprises a second pair of semiconductor switches (135, 137) including a high side switch 135 with its output terminals (133, 139) coupled in series with a low side diode 145 and a low side switch 137 with its output terminals (143, 147) coupled in series with a high side diode 45 for the second phase 153 of the controller 111. For the second phase 153, a high side semiconductor switch 135 has its output terminals (133, 139) coupled in parallel with a protecting diode 28, whereas a low side semiconductor switch 137 has its output terminals (143, 147) coupled in parallel with a protecting diode 30.

Third, in the third phase 253 ("Phase C") the controller 111 or inverter comprises a third pair of semiconductor switches (235, 237) including a high side switch 235 with its output terminals (233, 239) coupled in series with a low side diode 155 and a low side switch 237 with its output terminals (243, 247) coupled in series with a high side diode 55 for the third phase 253 of the controller 111. For the third phase 253, a high side semiconductor switch 235 has its output terminals (233, 239) coupled in parallel with a protecting diode 28, whereas a low side semiconductor switch 237 has its output terminals (243, 247) coupled in parallel with a protecting diode 30.

As used throughout this document, the output terminals comprise controlled or switched terminals, such as the collector and emitter of a semiconductor switch, or the drain and source of a field effect transistor. Similarly, as used herein, the control terminals comprise a base of a transistor or gate of a field effect transistor. Although FIG. 1 and FIG. 2 each illustrate a three-phase controller for controlling an electric motor (45 or 15), a controller may generally have one or more phases and a controller with two or more phases may be used to practice any embodiment of this disclosure.

In one embodiment, the inverter circuit or inverter is powered by a direct current (DC) voltage bus (64, 66 collectively). For example, in FIG. 2 a direct current voltage bus (64, 66) is coupled to collector and emitter terminals of each pair of semiconductor switches, or source and drain terminals of the semiconductor switches for each phase. A capacitor 13, such as an electrolytic capacitor may be coupled between the voltage rails or terminals of the direct current voltage bus (64, 66) to smooth or reduce ripple (e.g., an alternating current component) in the direct current or to otherwise filter the direct current.

In one embodiment, a brake chopper 34 is coupled to between the terminals (64, 66) of the direct current voltage bus. For example, the brake chopper 34 may comprise a voltage regulator. The brake chopper 34 or voltage regulator is capable of regulating the voltage on the direct current data bus from fluctuations that might otherwise occur because of coupling of the direct current voltage bus to an energy source, such as a generator, an alternator, or a regenerative braking hub of a vehicle. The brake chopper 34 may regulate the voltage level of the direct current voltage bus to charge properly the capacitor 13, an energy storage device (e.g., battery) coupled to the direct current voltage bus, or both.

In one configuration, the brake chopper comprises a braking semiconductor switch 234 with its controlled terminals coupled in series with a resistor 134 to convert excess voltage into thermal energy in accordance with the activation signal applied to the base or gate of the braking semiconductor switch 234. The base, gate or control terminal of the braking semiconductor switch may be connected to and controlled by the data processor 10, which bases a control signal on readings or measurements of the voltage sensor 32 in excess of a target maximum direct current voltage on the direct current voltage bus (64, 66) during a sampling period or a certain minimum time interval.

The input terminal or control terminal (A1, A2, B1, B2, C1, C2) of each semiconductor switch (35, 37, 135, 137, 235, 237) is coupled to the driver 12. The input terminal or control terminal of each semiconductor switch (35, 37, 135, 137, 235, 237) may comprise a gate or a base, for example. The output terminal of each semiconductor switch is coupled to a terminal of a motor winding (21, 22, or 23). Each different phase of the motor 15 may be associated with a corresponding motor winding (21, 22, or 23).

A first terminal of a first motor winding 21 (for Phase A) may be coupled to an emitter or output terminal 39 of the high side semiconductor switch 35 of the first phase 53 and second terminal of the winding 21, opposite of the first terminal, may be coupled to a collector or output terminal 43 of a low side semiconductor switch 37 of the first phase 53. A first terminal of a second motor winding 22 (for Phase B) may be coupled to an emitter or output terminal 139 of the high side semiconductor switch 135 of the second phase 153 and second terminal of the winding 22, opposite of the first terminal, may be coupled to a collector or output terminal 143 of a low side semiconductor switch 137 of the second phase 153. A first terminal of a third motor winding 23 (for Phase C) may be coupled to an emitter or output terminal 239 of the high side semiconductor switch 235 of the third phase 253 and second terminal of the winding 23, opposite of the first terminal, may be coupled to a collector or output terminal 243 of a low side semiconductor switch 237 of the third phase 253.

As shown in FIG. 2, a protecting diode (28, 30) may be coupled between the collector and emitter (or the source and drain) of each semiconductor switch (35, 37, 135, 137, 235, 237) to limit the current flowing in between the collector and emitter during transient states in which the semiconductor switch is deactivated (e.g., switched off) or activated (e.g., switched on).

A measuring circuit or voltage sensor 32 is coupled between the direct current voltage bus terminals (64, 66). The voltage sensor 32 is adapted to measure the lower voltage level of the test mode, the higher level of the test mode, or both. The voltage sensor 32 can detect a material deviation or transient deviation (e.g., decrease or collapse) from the lower voltage level or direct current bus voltage that may occur when one or more semiconductor switches (35, 37, 135, 137, 235, 237) are activated and a related switch of the same phase as the activated switch has a short circuit (e.g., as a failure mode).

The voltage sensor 32 or measuring circuit provides a high input impedance relative to the semiconductor switch (35, 37, 135, 137, 235, 237) and the direct current voltage bus (64, 66) such that the voltage sensor 32 or the measuring circuit does not perturb the performance of the semiconductor switch or draw material current (e.g., emitter current or collector current) from the semiconductor switch or the direct current voltage bus (64, 66). In one embodiment, the voltage sensor 32 or the measuring circuit may comprise a high impedance voltage meter or voltage sensor. For example, the measuring circuit may comprise a high impedance voltage sensor that is uses one or more operational amplifiers for comparison of an input voltage to a reference voltage. The reference voltage may be provided by a battery, a voltage regulator, or a Zener diode, for example. In one configuration, the output of the voltage sensor may be coupled to an analog-to-digital converter to provide a suitable digital input for the data processor 10.

The measuring circuit or voltage sensor 32 may provide an analog output or a digital output. As shown in FIG. 2, the voltage sensor 32 is coupled to the data processor 10 to provide a digital output thereto. If the voltage sensor 32 or measuring circuit provides an analog output, an analog-to-digital converter may be interposed between the voltage sensor 32 and the inputs of the data processor 10. The measuring circuit or voltage sensor 32 is capable of detecting a decrease or collapse in the direct current voltage bus when a semiconductor switch (35, 37, 135, 137, 235, 237) is activated or turned on. Accordingly, the measuring circuit or voltage sensor 32 is well suited for identifying fault or short circuit in a semiconductor switch (35, 37, 135, 137, 235, 237) or protecting diode 28, such that in the test mode the current initially associated with the early detected short circuit or fault may be insufficient to damage the motor 15 or electrical machine.

The driver 12 provides digital signals for activating the semiconductor switches (35, 37, 135, 137, 235, 237) in accordance with a desired input signal or control signals from the data processor 10. For example, during operation of the motor 15 in an operational mode, the input signal may comprise a sinusoidal signal, a square wave signal or another signal. During a diagnostic mode or a test mode, the input signal may provide input signals or control signals to selectively activate one or more of the semiconductor switches (35, 37, 135, 137, 235, 237) to prevent damage to one or more motor windings (21, 22, 23) or one or more permanent magnets of the motor 15.

In some cases, the data processor 10 may lower (e.g., slightly, but with suitable bias to activate or turn on the switch) the input voltage to the gate or base input of the semiconductor switch (35, 37, 135, 137, 235, 237) with a greater than typical or normal leakage current to ensure the semiconductor device is operating within a desired operational zone that minimizes any fault or short circuit current in the switched output terminals of the semiconductor device.

A data processor 10 determines that a short circuit or fault in a particular semiconductor switch (35, 37, 135, 137, 235, 237) is present if the measured collector-emitter voltage or measured source-drain voltage (by the voltage sensor 32) for the particular semiconductor switch is lower than a minimum threshold (e.g., over at least one complete cycle or waveform of an inverter driver 12 signal) or approaches zero during a sampling period. A driver 12 or a logic control circuit simultaneously activates counterpart switches of like direct current input polarity that are coupled to other phase windings (21, 22, or 23) of the electric motor 15 than the particular semiconductor switch (35, 37, 135, 137, 235, 237) to prevent demagnetization of the permanent magnets in the electric motor 15.

In FIG. 2, the motor 15 is associated with a position sensor 17 (e.g., a position sensor, a resolver or encoder position sensor) that is associated with the motor shaft or the rotor of the motor 15. For example, the position sensor 17 may comprise a magnetic field sensor (e.g., Hall Effect sensor) that detects a shaft or rotor position of a magnet secured to the shaft. The position sensor 17 provides position data, velocity data, or acceleration data for the shaft or rotor of the motor 15. The position data, velocity data or acceleration data can be provided from the position sensor 17 to the data processor 10 (e.g., in a digital format or analog format). For example, the position sensor 17 provides position data for a corresponding time instant to the data processor 10.

In one configuration, the position sensor 17 may comprise one or more of the following: a direct current motor, an optical encoder, a magnetic field sensor (e.g., Hall Effect sensor), magneto-resistive sensor, and a resolver (e.g., a brushless resolver). The output of the sensor is capable of communication with a position and speed processing module (e.g., electronic or software module) in the data processor 10. In one embodiment, the sensor 17 may be coupled to an analog-to-digital converter (not shown) that converts analog position data or velocity data to digital position or velocity data, respectively. In other embodiments, the sensor (e.g., digital position encoder) may provide a digital data output of position data or velocity data for the motor shaft or rotor.

One or more current sensors (59, 159, 259) and one or more winding temperature sensors 19 provide feedback data to the data processor 10 for processing. For example, a current sensor (59, 159, 259) is associated with each phase or winding (21, 22, 23) of the motor 15. The current sensor (59, 159, 259) provides feedback data (e.g., current feedback data, such as $i_a$, $i_b$, $i_c$) among other possible feedback data or signals, for example. Other possible feedback data includes, but is not limited to, winding temperature readings, semiconductor temperature readings of the inverter circuit, three phase voltage data, or other thermal or performance information for the motor 15. As illustrated in FIG. 2, one or more winding temperature sensors 19 provide winding sensor measurements, winding sensor data, or thermal data, thermal measurements or thermal signals to the data processor 10 for processing.

The temperature sensors 19 may provide temperature data or thermal data to rotor magnet temperature estimation module in the data processor 10. In turn, the temperature estimation module in the data processor 10 may scale or adjust one or more outputs of the inverter to compensate for inefficiency or reduced performance associated with thermal degradation.

Figure 3:
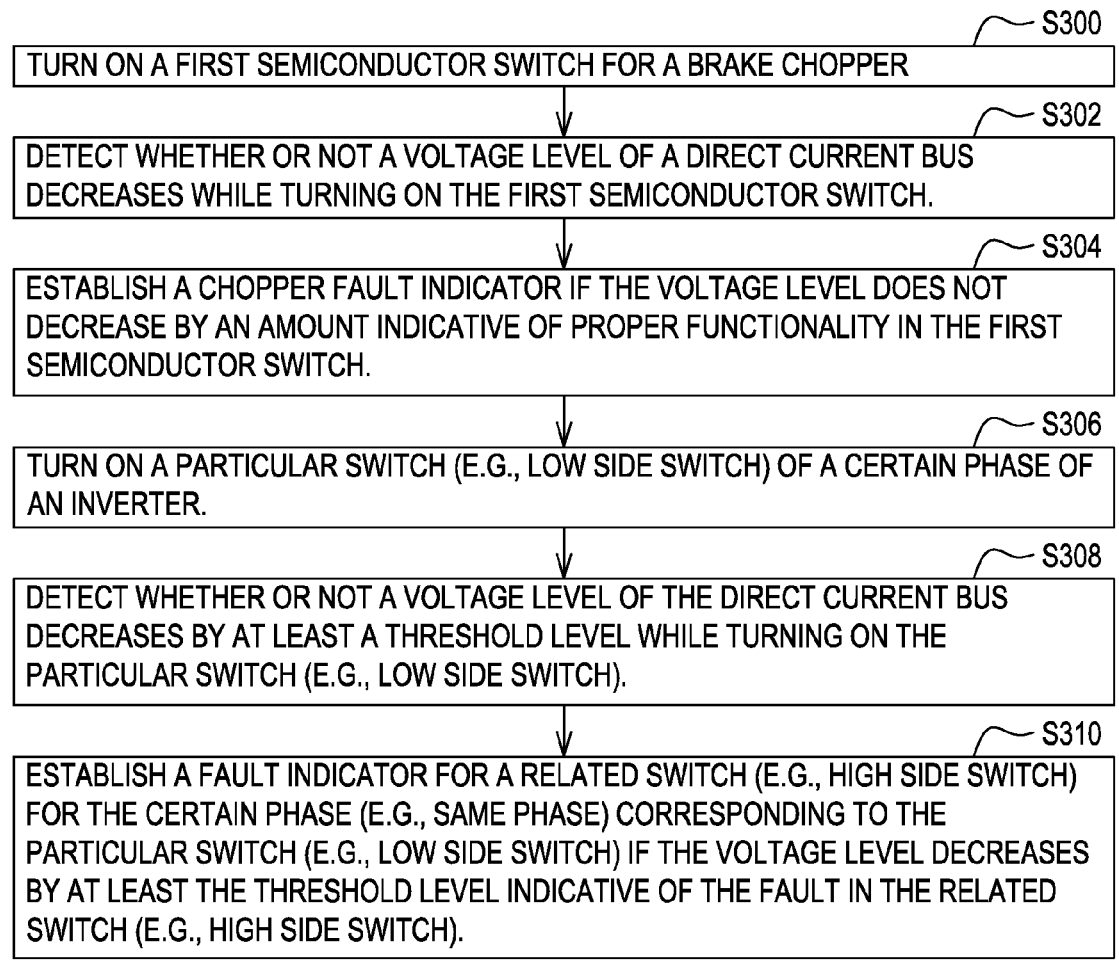
FIG. 3 is a flow chart of a first embodiment of a method for controlling an electrical motor with switch testing.

The method of FIG. 3 begins in step S300.

In step S300, a data processor 10 or driver 12 turns on a first semiconductor switch 234 for brake chopper 34. For example, the data processor 10 or driver 12 turns on the braking semiconductor switch 234 of FIG. 2. The braking semiconductor switch 234 may have switched terminals or controlled terminals coupled in series with a resistor 134 or resistive network (e.g., resistive voltage divider).

In step S302, a data processor 10 or voltage sensor 32 detects whether or not a voltage level of a direct current bus (64, 66) decreases while turning on the first semiconductor switch. For example, the voltage sensor 32 may detect whether or not the voltage level of the direct current bus (64, 66) decreases in proportion to the resistance provided by one or more resistors 134, a resistive network, or a resistive voltage divider, in the brake chopper 34.

In step S304, the data processor 10 establishes a chopper fault indicator if the voltage level does not decrease by an amount indicative of proper functionality in the first semiconductor switch 234. The chopper fault indicator indicates that the chopper 34 or its first semiconductor switch 234 has a deficiency (e.g., short circuit or open circuit failure between the controlled terminals of the first semiconductor switch 234). For example, if the voltage level does not decrease when the first semiconductor switch 234 is turned on, it may indicate any of the following: (1) the first semiconductor switch 234 is in a short-circuit failure mode, (2) that the direct current bus (64,66) is heavily loaded by the motor (15 or 45) or another load (e.g., weak battery with a lower than normal resistance between its batteries), or (3) the first semiconductor switch 234 has failed in an open-circuit failure mode.

In step S306, the data processor 10 or driver 12 turns on a particular switch (e.g., low side switch 82, 182, 282, 37, 137, 237) of a certain phase (80, 180, 280, 53, 153, 253) of a controller (11 or 111) or inverter.

In step S308, the data processor 10 or driver 12 detects whether or not a voltage level of the direct current bus (64, 66) decreases by at least a threshold level while turning on the particular switch (e.g., low side switch 82, 182, 282, 37, 137, 237). In the controller 11 of FIG. 1, the particular switch may comprise one of the low side switches (82, 182, 282) or one of the high side switches (81, 181, 281). Similarly, with respect to the controller 111 of FIG. 2, the particular switch may comprise one of the low side switches (37, 137, 237) or one of the high side switches (35, 135, 235).

In one illustrative example, step S308 may be carried out as follows. At a first time interval, the voltage sensor 32 measures or detects a first voltage level prior to turning on the particular switch while the dual voltage supply is operating at lower test voltage level; a second time interval, the voltage sensor 32 measures or detects a second voltage level during or after turning on the particular switch while the dual voltage supply 29 is operating at the lower test voltage level. The data processor 10 may compare the measured voltage difference between the first voltage level (measured at the first time interval) and the second voltage level (measured at the second time interval after the first time interval). If the measured voltage difference is greater than or equal to the threshold level stored in the data storage device 67, the voltage level has decreased by at least the threshold level.

In step S310, the data processor 10 establishes a fault indicator for a related switch (e.g., high side switch of the same phase as the activated low side switch in step S308) for the certain phase (e.g., same phase) corresponding to the particular switch (e.g., low side switch) if the voltage level decreases by at least the threshold level indicative of the fault in the related switch (e.g., the high side switch 81, 181, 281, 35, 135, 235). Step S310 may be executed by various techniques that may be applied alternately or cumulatively.

Under a first technique for carrying out step S310, current level (e.g., collector current) in the phase or corresponding current in the winding for the phase is evaluated to confirm or verify the existence of the fault prior to establishing the fault indicator. For example, the data processor 10 establishes a fault indicator for a related switch (e.g., high side switch of the same phase as the activated low side switch in step S308) for the certain phase (e.g., same phase) corresponding to the particular switch (e.g., low side switch) if the voltage level decreases by at least the threshold level indicative of the fault in the related switch (e.g., the high side switch 81, 181, 281, 35, 135, 235) and if a current level (measured by the current sensor (59, 159, 259) flowing between the switched terminals of the related semiconductor switch (or associated with the winding of the motor 45 for the same phase as the related semiconductor switch) is greater than a maximum current (e.g., an over current threshold or a maximum test current threshold selected based on the test voltage applied by the dual voltage supply 29) over a sampling time period.

Under a second technique, the data processor 10 can use the measured current level for each phase to confirm or verify a candidate fault of a switch preliminarily indicated by the voltage measurements of the voltage sensor 32, and to identify the certain phase or deficient phase with the deficiency (e.g., short circuit) of semiconductor switch. For example, the data processor 10 establishes a fault indicator for a related switch (e.g., high side switch of the same phase as the activated low side switch in step S308) for the certain phase (e.g., same phase) corresponding to the particular switch (e.g., low side switch) if the voltage level decreases by at least the threshold level indicative of the fault in the related switch (e.g., the high side switch 81, 181, 281, 35, 135, 235) and if the data processor 10 determines the measured current level for the certain phase or deficient phase is greater than a maximum current (e.g., an over current threshold or a maximum test current threshold selected based on the test voltage applied by the dual voltage supply 29) over a sampling period.

Under a third technique, the data processor 10 can use the measured current level for each phase to confirm or verify a candidate fault of a switch preliminarily indicated by the voltage measurements of the voltage sensor 32 as indicated in the first technique or the second technique, and to rule out the impact of any possible short circuits in one or more windings of the motor 45, as opposed to a deficiency in a semiconductor device of the controller 11.

Under a fourth technique, for carrying out step S310, current level (e.g., collector current) in the phase or corresponding current in the winding for the phase is evaluated to confirm or verify the existence of the fault prior to establishing the fault indicator. For example, the data processor 10 establishes a fault indicator for a related switch (e.g., high side switch of the same phase as the activated low side switch in step S308) for the certain phase (e.g., same phase) corresponding to the particular switch (e.g., low side switch) if the voltage level decreases by at least the threshold level indicative of the fault in the related switch (e.g., the high side switch 81, 181, 281, 35, 135, 235) and if measured current polarity by the current sensor (e.g., 59, 159, 259) of the certain phase at the output terminal (e.g., 24, 124, 224) conforms to an improper polarity that is inconsistent with the activated switches by the driver 12, as instructed by the data processor 10.

The method of FIG. 3 is well suited for localization of the fault in the controller 11 and identifying a specific faulty switch or particular deficient semiconductor switch with a short circuit between the controlled or switched terminals. The method of FIG. 3 eliminates or reduces false positives for short circuits of the switches by using both voltage measurements of the voltage sensor 32 and current measurements of one or more current sensors (59, 159, 259), where each phase (80, 180, 280) has a dedicated current sensor (59, 159, 259.)

Figure 4:
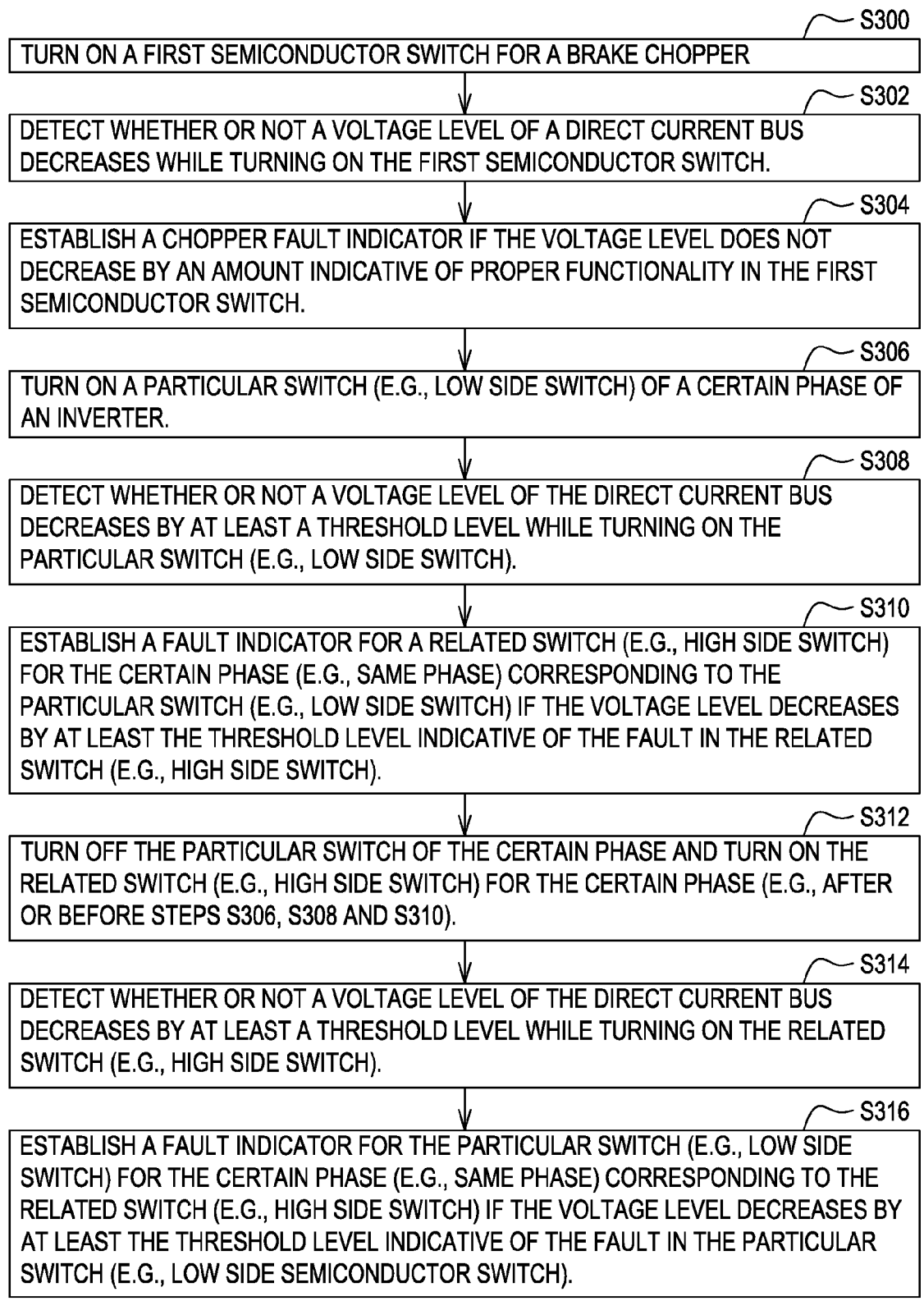
FIG. 4 is a flow chart of a second embodiment of a method for controlling an electrical motor with switch testing.

The method of FIG. 4 is similar to the method of FIG. 3, except the method of FIG. 4 further comprises additional steps S312, S314, and S316. Like steps or procedures are indicated by like reference numbers in FIG. 3 and FIG. 4.

In step S312, the data processor 10 or driver 12 turns of the particular switch of the certain phase (e.g., the particular switch that was activated in step S306) and turns on the related switch (e.g., opposite switch from the particular switch that was activated in step S306 or the high side switch)

for the certain phase. Step S312 may be executed after or before steps S306, S308 and S310, for example.

In step S314, the data processor 10, voltage sensor 32, or both detect whether or not a voltage level of the direct current bus (64, 66) decreases by at least a threshold level while turning on the related switch (e.g., high side switch). In one illustrative example, step S314 may be carried out as follows. At a third time interval, the voltage sensor 32 measures or detects a third voltage level prior to turning on the related switch while the dual voltage supply 29 is operating at lower test voltage level; a fourth time interval, the voltage sensor 32 measures or detects a second voltage level during or after turning on the related switch while the dual voltage supply 29 is operating at the lower test voltage level. The data processor 10 may compare the measured voltage difference between the third voltage level (measured at the third time interval) and the fourth voltage level (measured at the fourth time interval after the third time interval). If the measured voltage difference is greater than or equal to the threshold level stored in the data storage device 67, the voltage level has decreased by at least the threshold level.

In an alternate embodiment, if step S314 is executed prior to step S308, then the third time interval and third voltage level may be referred to as the primary time interval and primary voltage level, respectively; the fourth time interval and the fourth voltage level may be referred to as the secondary time interval and the secondary voltage level, respectively.

In step S316, the data processor 10 establishes a fault indicator for the particular switch (e.g., a low side switch) for the certain phase (e.g., same phase) corresponding to the related switch (e.g., high side switch) if the voltage level decreases by at least the threshold voltage level indicative of the fault in the particular switch (e.g., low side semiconductor switch).

Figure 5:
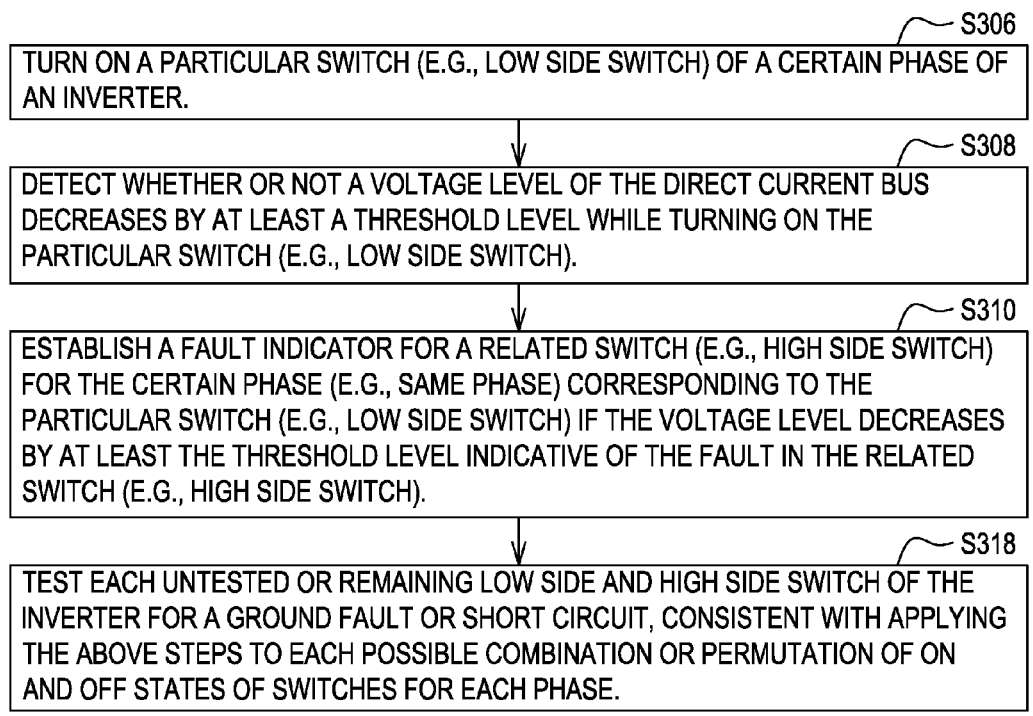
FIG. 5 is a flow chart of a first embodiment of a method for controlling an electrical motor with switch testing.

The method of FIG. 5 is similar to the method of FIG. 3, except the method of FIG. 5 deletes steps S300 and S302 of FIG. 3 and adds step S318. Like reference numbers in FIG. 3 and FIG. 5 indicate like steps or procedures.

In step S306, the data processor 10 or driver 12 turns on a particular switch (e.g., low side switch) of a certain phase of a controller (11 or 111) or inverter.

In step S308, the data processor 10 or driver 12 detects whether or not a voltage level of the direct current bus (64, 66) decreases by at least a threshold level while turning on the particular switch (e.g., a low side switch). In the controller 11 of FIG. 1, the particular switch may comprise one of the low side switches (82, 182, 282) or one of the high side switches (81, 181, 281). Similarly, with respect to the controller 111 of FIG. 2, the particular switch may comprise one of the low side switches (37, 137, 237) or one of the high side switches (35, 135, 235).

In one illustrative example, step S308 may be carried out as follows. At a first time interval, the voltage sensor 32 measures or detects a first voltage level prior to turning on the particular switch while the dual voltage supply 29 is operating at lower test voltage level; a second time interval, the voltage sensor 32 measures or detects a second voltage level during or after turning on the particular switch while the dual voltage supply 29 is operating at the lower test voltage level. The data processor 10 may compare the measured voltage difference between the first voltage level (measured at the first time interval) and the second voltage level (measured at the second time interval after the first time interval). If the measured voltage difference is greater than or equal to the threshold level stored in the data storage device 67, the voltage level has decreased by at least the threshold level.

In step S310, the data processor 10 establishes a fault indicator for a related switch (e.g., high side switch of the same phase as the activated low side switch in step S308) for the certain phase (e.g., same phase) corresponding to the particular switch (e.g., low side switch) if the voltage level decreases by at least the threshold level indicative of the fault in the related switch (e.g., the high side switch).

In step S318, the data processor 10 tests each untested or remaining low side and high side switch of the inverter or controller (11 or 111) for a ground fault or short circuit, consistent with applying the above steps to each possible combination or permutation of on and off states of switches for each phase (e.g., phases 80, 180, 280 in FIG. 1; or phases 53, 153, 253 in FIG. 2). As used throughout this document, an on state means a biasing voltage is applied to the control terminal (e.g., gate or base) of the semiconductor switch to activate the semiconductor switch (e.g., to form a low resistance electrical path between the controlled terminals) or to change the state of conductivity or resistance between the controlled terminals. Similarly, an off state means a biasing voltage is removed from the control terminal (e.g., gate or base) of the semiconductor switch to deactivate the semiconductor switch (e.g., to form a high resistance electrical path between the controlled terminals) or to change the state of conductivity or resistance between the controlled terminals.

Figure 6:
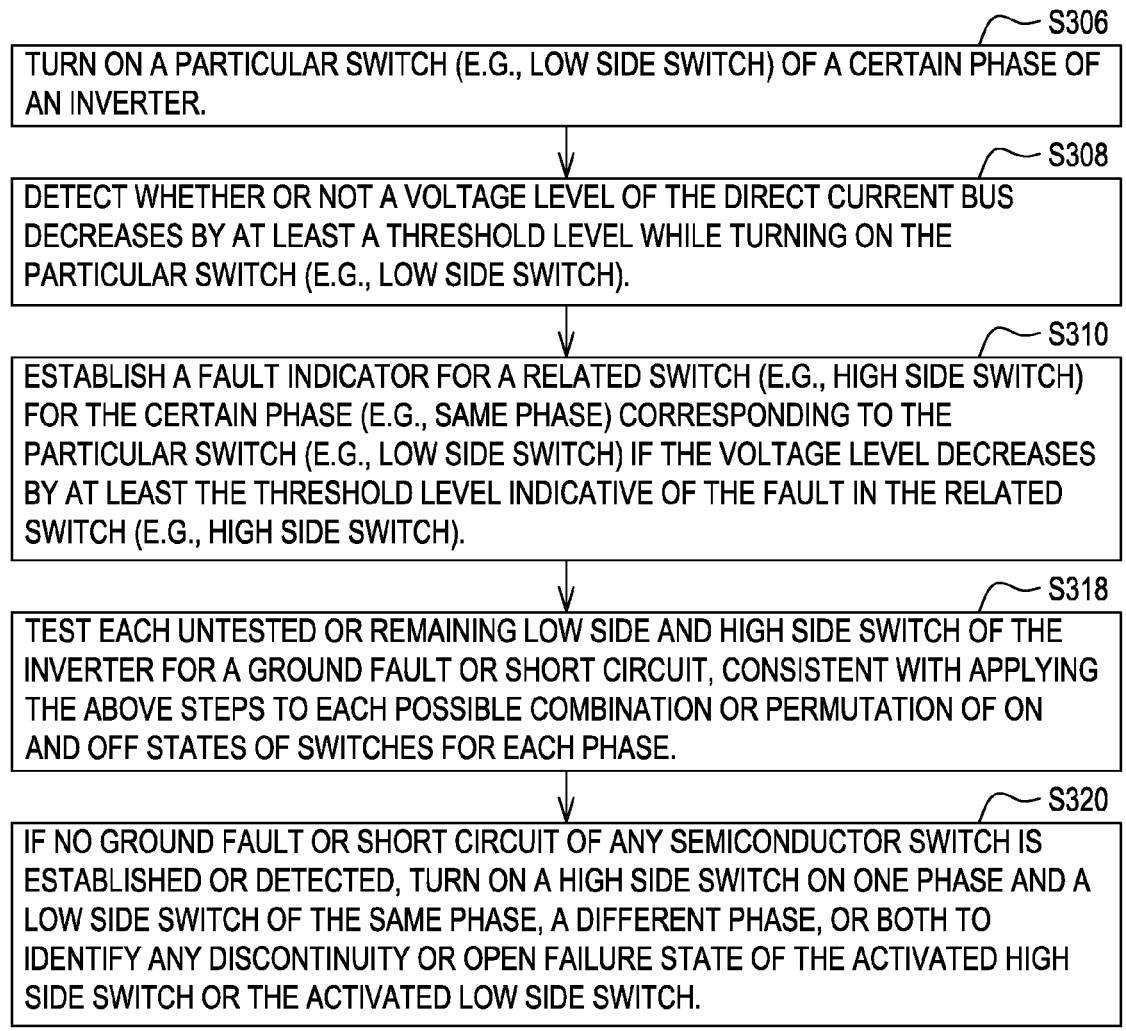
FIG. 6 is a flow chart of a second embodiment of a method for controlling an electrical motor with switch testing.

The method of FIG. 6 is similar to the method of FIG. 5, except the method of FIG. 6 further comprises step S310. Like reference numbers in FIG. 5 and FIG. 6 indicate like steps or procedures.

In step S320, if the data processor 10 does not establish or detect any ground fault or short circuit of any semiconductor switch, the data processor 10 instructs the driver 12 to turn on a high side switch on one phase and a low side switch of the same phase, a different phase, or both (e.g. sequentially for each phase of the inverter until all semiconductor switches phases are tested) to identify any discontinuity or open failure state of the activated high side switch or the activated low side switch. Step S320 may be carried out in accordance with various techniques that may be applied cumulatively or separately.

Under a first technique for executing step S320, if the data processor 10 does not establish or detect any ground fault or short circuit of any semiconductor switch, the data processor 10 instructs the driver 12 to turn on a high side switch on one phase and a low side switch of the same phase (e.g. sequentially for each phase of the inverter until all semiconductor switches phases are tested) to identify any discontinuity or open failure state of the activated high side switch or the activated low side switch. If the voltage sensor 32 does not provide a decrease in the observed voltage level across the direct current bus (64, 66) to the data processor 10 when activating both the high side switch and the low side switch of the same phase, the data processor 10 determines that at least the low side switch or the high side switch has failed in an open state. In step S320, the data processor 10 may apply the foregoing technique to the electric motor 45 of FIG. 1, regardless of whether the windings (44, 46, 48) are floating or grounded to optional ground connection 49.

Under a second technique of carrying out step S320 (e.g., for a floating ground or ungrounded windings (44, 46, 48), for a motor 45) if the data processor 10 does not establish or detect any ground fault or short circuit of any semiconductor switch, the data processor 10 instructs the driver 12 to turn on a high side switch on one phase and a low side switch of another phase (e.g. sequentially for each possible combination of semiconductor switches of the inverter) to identify any deficiency (e.g., open circuit) of the activated high side switch or the activated low side switch of different phases. If the resistance or reactance of the windings of the motor 45 is introduced between the activated low side switch and the activated high side switch of different phases, the voltage sensor 32 may or may not provide a sufficiently detectable decrease in the observed voltage level across the direct current bus (64, 66) to the data processor 10 when activating both the high side switch and the low side switch of the same phase. Accordingly, the data processor 10 may set a current threshold (e.g., maximum test current threshold) lower than the maximum current (e.g., maximum operational current threshold) for one or more phase, to determine whether the expected current (indicative of proper switch function) at one or more current sensors (59, 159, 259) flow through the phases during activation of the low side switch and the high side switch of difference phases. If the data processor 10 does not receive the observed, expected current (e.g., magnitude or logic signal) from the one or more current sensors (59, 159, 259), then the activated low side switch, the activated high side switch of different phase, or both have failed in an open state.

Figure 7:
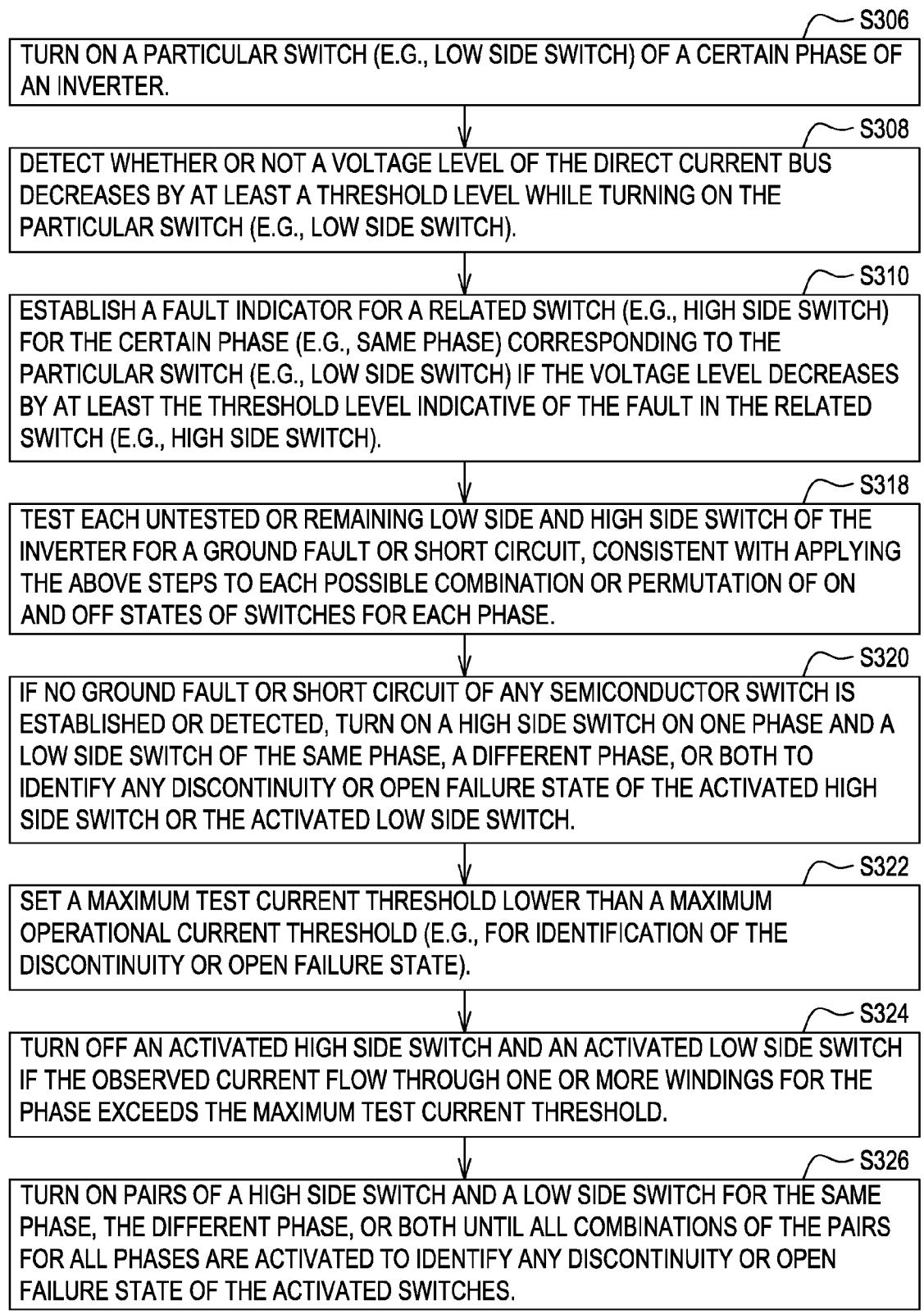
FIG. 7 is a flow chart of a third embodiment of a method for controlling an electrical motor with switch testing.

The method of FIG. 7 is similar to the method of FIG. 5, except the method of FIG. 7 further comprises step S320, S322, S324 and S326. Like reference numbers in FIG. 5 and FIG. 6 indicate like steps or procedures.

In step S320, if the data processor 10 does not establish or detect any ground fault or short circuit of any semiconductor switch, the data processor 10 instructs the driver 12 to turn on a high side switch on one phase and a low side switch of the same phase, a different phase, or both (e.g. sequentially for each phase of the inverter until all semiconductor switches phases are tested) to identify any discontinuity or open failure state of the activated high side switch or the activated low side switch. Step S320 may be carried out in accordance with various techniques that may be applied cumulatively or separately.

Under a first technique for executing step S320, if the data processor 10 does not establish or detect any ground fault or short circuit of any semiconductor switch, the data processor 10 instructs the driver 12 to turn on a high side switch on one phase and a low side switch of the same phase (e.g. sequentially for each phase of the inverter until all semiconductor switches phases are tested) to identify any discontinuity or open failure state of the activated high side switch or the activated low side switch. If the voltage sensor 32 does not provide a decrease in the observed voltage level across the direct current bus (64, 66) to the data processor 10 when activating both the high side switch and the low side switch of the same phase, the data processor 10 determines that at least the low side switch or the high side switch has failed in an open state. In step S320, the data processor 10 may apply the foregoing technique to the electric motor 45 of FIG. 1, regardless of whether the windings (44, 46, 48) are floating or grounded to optional ground connection 49.

Under a second technique of carrying out step S320 (e.g., for a floating ground or ungrounded windings (44, 46, 48), for a motor 45) if the data processor 10 does not establish or detect any ground fault or short circuit of any semiconductor switch, the data processor 10 instructs the driver 12 to turn on a high side switch on one phase and a low side switch of the another phase (e.g. sequentially for each possible combination of semiconductor switches of the inverter) to identify any deficiency (e.g., open circuit) of the activated high side switch or the activated low side switch of different phases. If the resistance or reactance of the windings of the motor 45 is introduced between the activated low side switch and the activated high side switch of different phases, the voltage sensor 32 may or may not provide a sufficiently detectable decrease in the observed voltage level across the direct current bus (64, 66) to the data processor 10 when activating both the high side switch and the low side switch of the same phase. Accordingly, the data processor 10 may execute steps S324 and S326 as more fully described below.

In step S322, the data processor 10 sets a maximum test current threshold lower than a maximum operational current threshold. For example, the data processor 10 may store or retrieve the maximum test current threshold from the data storage device 67. For example, the data processor 10 sets a current threshold (e.g., maximum test current threshold) lower than the maximum current (e.g., maximum operational current threshold) for one or more phase, to determine whether the observed, expected current (indicative of proper switch function) at one or more current sensors (59, 159, 259) flow through the phases during activation of the low side switch and the high side switch of difference phases. If the data processor 10 does not receive the observed expected current indicator (e.g., magnitude or logic signal) from the one or more current sensors (59, 159, 259), then the activated low side switch, the activated high side switch of different phase, or both have failed in an open state.

In step S324, a data processor 10 may instruct the driver 12 may turn off an activated high side switch and an activated low side switch phase (e.g., of the same phase or different phases) if the current flow through one or more current sensors (59, 159, 250) or the associated windings (of the motor 45) for the phase exceeds the maximum test current threshold. Alternately, the data processor 10 may send a command or control signal to the dual voltage supply 29 to remove direct current voltage from the direct current voltage bus.

In step S326 the data processor 10 or the driver 12 may turn on pairs of a high side switch and a low side switch for the same phase, the different phase, or both until all combinations of the pairs for all phases are activated to identify any discontinuity or open failure state of the activated switches.

In an alternate example of carrying out step S326, the data processor 10 or the driver 12 may turn on pairs of a high side switch and a low side switch for the different phase until all combinations of the pairs for all phases are activated to identify any discontinuity or open failure state of the activated switches.

Figure 8:
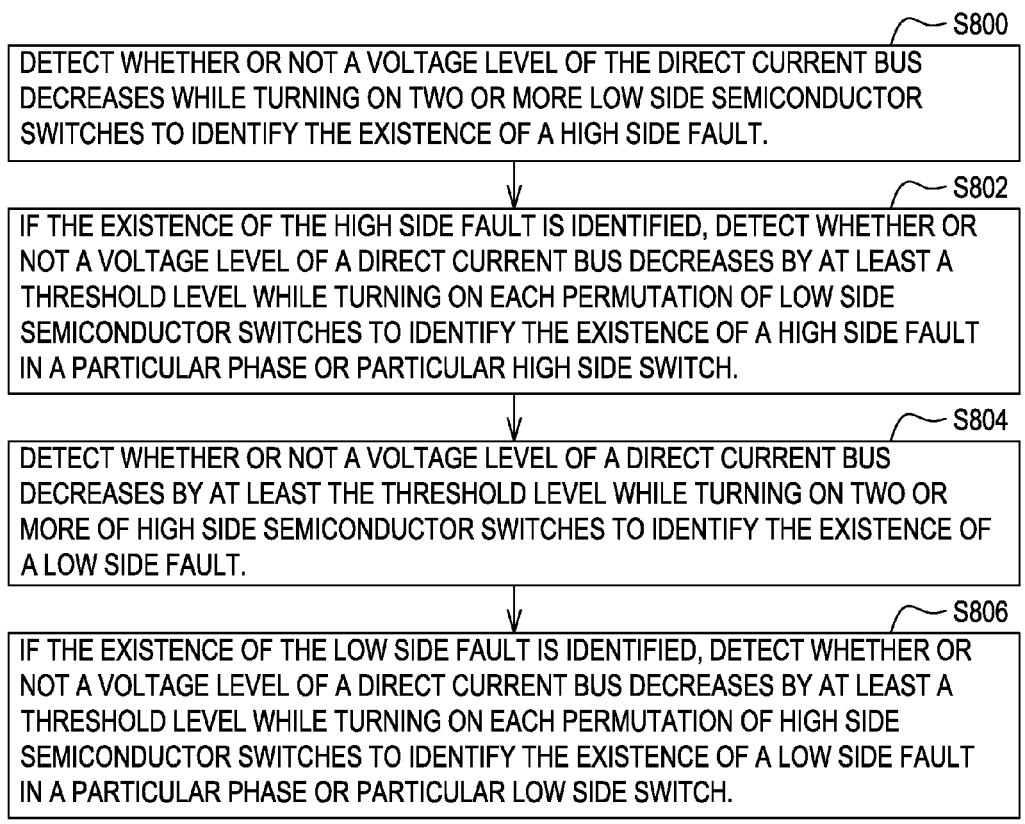
FIG. 8 is a flow chart of a fourth embodiment of a method for controlling an electrical motor with switch testing.

The method of FIG. 8 begins in step S800.

In step S800, the data processor 10 detects whether or not a voltage level of the direct current bus (64, 66) decreases while the data processor 10 instructs the driver 12 to turn on two or more low side semiconductor switches to identify the existence of a high side fault. The voltage sensor 32 measures the voltage level of the direct current bus (64, 66) and provides the measured voltage level to the data processor 10 for processing.

In step S802, if the existence of the high side fault is identified, the data processor 10 detects whether or not a voltage level of a direct current bus (64, 66) decreases by at least a threshold level while the data processor 10 instructs the driver 12 to turn on each permutation of a low side semiconductor switches to identify the existence of a high side fault in a particular phase or particular high side switch. The voltage sensor 32 measures the voltage level of the direct current bus (64, 66) and provides the measured voltage level to the data processor 10 for processing.

In one illustrative example, step S802 may be carried out as follows. At a first time interval, the voltage sensor 32 measures or detects a first voltage level prior to turning on the particular low side switch while the dual voltage supply is operating at lower test voltage level; a second time interval, the voltage sensor 32 measures or detects a second voltage level during or after turning on the particular low side switch while the dual voltage supply 29 is operating at the lower test voltage level. The data processor 10 may compare the measured voltage difference between the first voltage level (measured at the first time interval) and the second voltage level (measured at the second time interval after the first time interval). If the measured voltage difference is greater than or equal to the threshold level stored in the data storage device 67, the voltage level has decreased by at least the threshold level.

In step S804, the data processor 10 detects whether or not a voltage level a direct current bus (64, 66) decreases by at least the threshold level while the data processor 10 instructs the driver 12 to turn on two or more of high side semiconductor switches to identify the existence of a low side fault.

In one illustrative example step S804 may be carried out as follows. At a third time interval, the voltage sensor 32 measures or detects a third voltage level prior to turning on two or more high side semiconductor switches while the dual voltage supply is operating at lower test voltage level; a fourth time interval, the voltage sensor 32 measures or detects a fourth voltage level during or after turning on the particular two or more high side semiconductor switches while the dual voltage supply 29 is operating at the lower test voltage level. The data processor 10 may compare the measured voltage difference between the third voltage level (measured at the third time interval) and the fourth voltage level (measured at the fourth time interval after the third time interval). If the measured voltage difference is greater than or equal to the threshold level stored in the data storage device 67, the voltage level has decreased by at least the threshold level.

In step S806, if the existence of the low side fault is identified, the data processor 10 detects whether or not a voltage level of a direct current bus (64, 66) decreases by at least a threshold level while turning on each permutation of high side semiconductor switches to identify the existence of a low side fault in a particular phase or particular low side switch.

In one illustrative example step S806 may be carried out as follows. At a fifth time interval, the voltage sensor 32 measures or detects a fifth voltage level prior to turning on the particular high side switch while the dual voltage supply is operating at lower test voltage level; a sixth time interval, the voltage sensor 32 measures or detects a sixth voltage level during or after turning on the particular high side switch while the dual voltage supply is operating at the lower test voltage level. The data processor 10 may compare the measured voltage difference between the fifth voltage level (measured at the fifth time interval) and the sixth voltage level (measured at the sixth time interval after the third time interval). If the measured voltage difference is greater than or equal to the threshold level stored in the data storage device 67, the voltage level has decreased by at least the threshold level.

Figure 9:
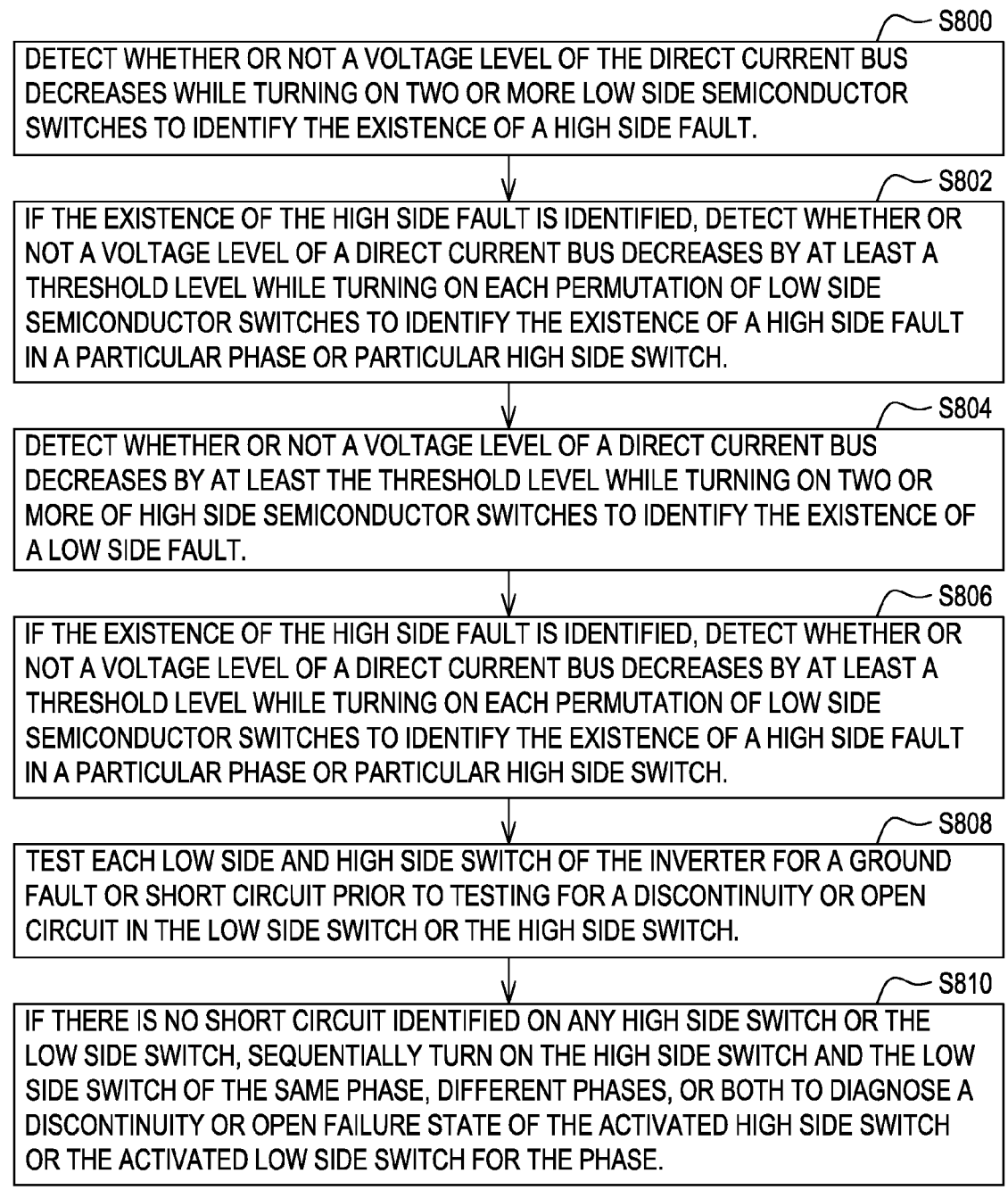
FIG. 9 is a flow chart of a fifth embodiment of a method for controlling an electrical motor with switch testing.

The method of FIG. 9 is similar to the method of FIG. 8, except the method of FIG. 9 further comprises steps S808 and S810. Like reference numbers in FIG. 8 and FIG. 9 indicate like steps or procedures.

In step S808, the data processor 10 controls the driver 12 to test each low side and high side switch of the inverter for a ground fault or a short circuit prior to the data processor 10 or controller testing for a discontinuity or open circuit in the low side switch or the high side switch.

In step S810, if the data processor 10 or controller does not identify any short circuit on any high side switch or the low side switch, the data processor 10 instructs the driver 12 to turn on sequentially the high side switch and the low side switch of the same phase, different phases, or both to diagnose a discontinuity or open failure state of the activated high side switch or the activated low switch for the phase.

Figure 10:
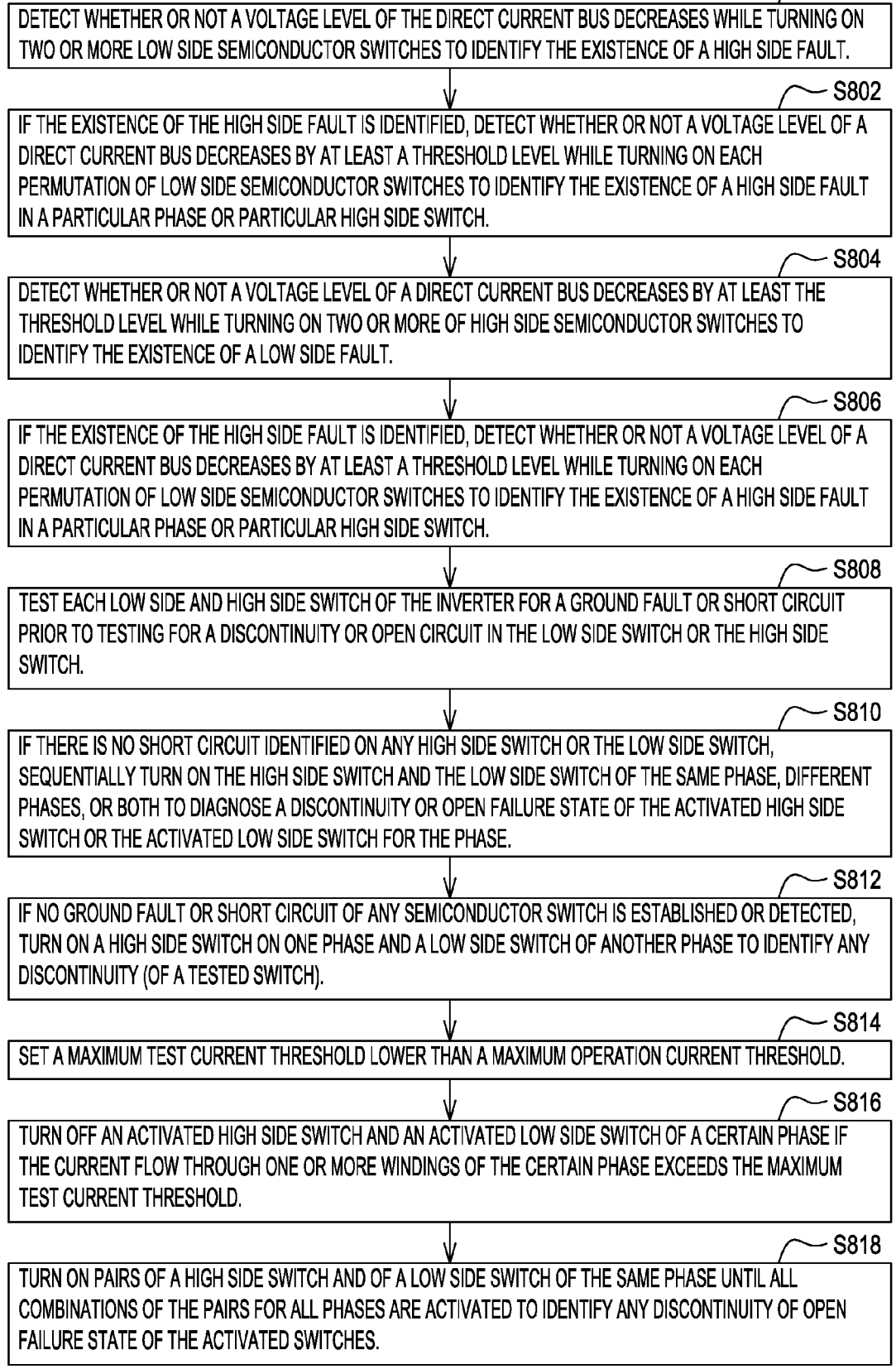
FIG. 10 is a flow chart of a sixth embodiment of a method for controlling an electrical motor with switch testing.

The method of FIG. 10 is similar to the method of FIG. 9, except the method of FIG. 10 further comprises steps S812, S814, S816 and S818. Like reference numbers in FIG. 8 and FIG. 9 indicate like steps or procedures.

In step S812, if the data processor 10 or controller does not establish or detect any ground fault or short circuit of any semiconductor switch, the data processor 10 or controller instructs the driver 12 to turn on a high side switch on one phase and a low side switch of another phase to identify any discontinuity (of a tested switch).

In step S814, the data processor 10 sets or establishes a maximum test current threshold lower than a maximum operation current threshold. The data processor 10 may retrieve the maximum test current threshold from the data storage device 67, for example. In one embodiment, the maximum test current may comprise a preprogrammed setting or a factory setting of the controller. In an alternate embodiment, a user or operator may reprogram or set the maximum test current by changing the value in the data storage device 67 via a user interface (e.g., a computer coupled to the data bus).

In step S816, the data processor 10 instructs the driver 12 to turn off an activated high side switch and an activated low side switch of a certain phase if the current follow through one or more windings of the certain phase exceeds the maximum test current threshold.

In step S818, the data processor 10 instructs the driver 12 to turn on pairs of a high side switch and of a low side switch of the same phase until all combinations of the pairs for all phases are activated to identify any discontinuity of open failure state of the activated switches.

The method and system is well-suited for detecting a fault or short circuit in particular semiconductor switch of the inverter or controller to prevent damage to the motor (15 or 45) connected to the inverter. For example, upon detection of a fault or short circuit in a semiconductor switch, the data processor 10 may disable operation of the controller at the higher operational voltage level to prevent damage to the controller or the motor (15 or 45) coupled to the controller. Alternately, upon detection of the fault or short circuit in a semiconductor switch, the data processor 10 may switch off the dual power supply or decouple the dual power supply or direct current energy source, while generating an error code or a diagnostic code for transmission to a user interface, display, light, light-emitting diode, buzzer, audible alarm, or other indicator.

Having described the preferred embodiment, it will become apparent that various modifications can be made without departing from the scope of the invention as defined in the accompanying claims.

The following is claimed:

1. A method for determining a deficiency in the operation of a semiconductor switch of a controller, the method comprising:

providing electrical energy to the semiconductor switches at a test voltage level less than a full operational voltage level;

activating a particular semiconductor switch of a certain phase of the controller;

measuring a direct current bus voltage; and determining that a deficiency in a tested, related semiconductor switch is present if the measured direct current bus voltage decreases or collapses by at least a material deviation or at least a transient deviation upon activation of the activated particular semiconductor switch in the same phase of the controller, the material deviation being a threshold difference value between the measured direct current bus voltage and the decreased or collapsed measured direct current bus voltage.

2. The method according to claim 1 further comprising:
preventing or inhibiting a voltage supply from providing the full operational voltage level to the direct current bus to prevent damage to the controller, or a motor coupled to the controller, if the deficiency in the related semiconductor switch is present.

3. The method according to claim 1 wherein the determining of the deficiency comprises determining that the deficiency in the related semiconductor switch is present if the measured direct current bus voltage decreases or collapses by at least the material deviation upon activation of the activated particular semiconductor switch in the same phase of the controller and if a current level flowing between switched terminals of the related semiconductor switch, for the same phase, is greater than a maximum current over a sampling time period.

4. The method according to claim 1 wherein the determining of the deficiency comprises determining that the deficiency in the related semiconductor switch is present if the measured direct current bus voltage decreases or collapses by at least the material deviation upon activation of the activated particular semiconductor switch in the same phase of the controller and if a current level flowing between switched terminals of the related semiconductor switch, for the same phase, is greater than a maximum current over a sampling time period to localize the deficiency to a particular deficient phase of an inverter section of the controller.

5. The method according to claim 1 wherein the deficiency comprises a fault or short circuit of the related semiconductor switch.

6. The method according to claim 1 further comprising:
simultaneously activating the particular semiconductor switch and the related switch of a certain phase of the controller; and
determining that a secondary deficiency in the particular semiconductor switch or the related semiconductor switch is present if the measured direct current bus voltage does not decrease or collapse upon the simultaneous activation of the activated particular semiconductor switch and the related semiconductor switch in the same phase of the controller.

7. The method according to claim 6 wherein the secondary deficiency comprises an open circuit of the particular semiconductor switch or the related semiconductor switch.

8. The method according to claim 1 further comprising:
simultaneously activating the particular semiconductor switch and the related switch of different phases of the controller; and
determining that a secondary deficiency in the particular semiconductor switch or the related semiconductor switch is present if the observed current through one or more windings of a motor does not exceed a maximum test current threshold during a sampling period.

9. The method according to claim 8 wherein the secondary deficiency comprises an open circuit of the particular semiconductor switch or the related semiconductor switch.

10. The method according to claim 1, wherein determining determines a deficiency in the tested, related semiconductor switch is present if the measured direct current bus voltage decreases or collapses by the transient deviation, the transient deviation being a deviation from the test voltage level.

11. A method for determining a deficiency in the operation of a semiconductor switch of a controller, the method comprising:

turning on a first semiconductor switch for a brake chopper;
detecting whether a voltage level of a direct current bus does not decrease while turning on the first semiconductor switch;
establishing a chopper fault indicator if the voltage level does not decrease by an amount indicative of the proper functionality of the first semiconductor switch;
turning on a particular low side switch of the controller;
detecting whether or not a voltage level of the direct current bus decreases by a material deviation or a transient deviation while turning on the particular low side semiconductor switch, the material deviation being a threshold difference value between the measured direct current bus voltage and the decreased or collapsed measured direct current bus voltage; and
establishing a high side fault indicator of a high side semiconductor switch for a phase corresponding to the particular low side semiconductor switch if the voltage level decreases by an amount indicative of a fault in a high side switch.

12. The method according to claim 11 further comprising:
turning on a particular high side semiconductor switch of the controller;
detecting whether or not the voltage level of the direct current bus decreases while turning on the particular high side semiconductor switch; and
establishing a low side fault indicator of the low side semiconductor switch for a phase corresponding to the particular high side semiconductor switch if the voltage level decreases by an amount indicative of a fault in a low side semiconductor switch.

13. The method according to claim 11 further comprising:
testing each low side semiconductor switch and high side semiconductor switch of the controller for a ground fault or short circuit.

14. The method according to claim 13 further comprising:
if no ground fault or short circuit of any semiconductor switch is established or detected, turning on a high side semiconductor switch on a certain phase and a low side semiconductor switch of the certain phase or a different phase to identify any discontinuity or open failure state of the activated high side semiconductor switch or the activated low side semiconductor switch.

15. The method according to claim 14 further comprising:
setting a maximum test current threshold lower than a maximum operational current threshold;
turning off the activated high side semiconductor switch and the activated low side semiconductor switch if detected current flow through one or more windings of the certain phase exceeds the maximum test current threshold, where no discontinuity or open failure state is identified.

16. The method according to claim 14 further comprising:
sequentially turning on pairs of a high side switch and of a low side switch of each phase or different phases until all combinations of the pairs are activated to identify any discontinuity of open failure state of the activated switches.

17. The method according to claim 11 further comprising:
if a short is detected on a high side semiconductor switch, turning on a low side semiconductor switch and checking for a current fault, where the detected current between controlled terminals of the high side semiconductor switch exceeds a maximum threshold;
triggering an expiration of a diagnostic timer if no fault is detected; and indicating a phase in the high side switch with the current fault if the diagnostic timer is triggered.

18. A method for determining a deficiency in the operation of a semiconductor switch of a controller, the method comprising:
first detecting whether or not a voltage level of a direct current bus decreases by a material deviation or a transient deviation while turning on two or more low side semiconductor switches to identify the existence of a high side fault, the material deviation being a threshold difference value between the voltage level of a direct current bus before the first detecting and the decreased or collapsed measured direct current bus voltage;
if the existence of the high side fault is identified, detecting whether or not the voltage level of the direct current bus decreases by a threshold level while turning on each permutation of low side semiconductor switches to identify the existence of the high side fault in a particular phase or particular high side semiconductor switch;
second detecting whether or not the voltage level of the direct current bus decreases by the material deviation or the transient deviation while turning on two or more of high side semiconductor switches to identify the existence of a low side fault; and
if the existence of the low side fault is identified, detecting whether or not the voltage level of the direct current bus decreases while turning on each permutation of high side semiconductor switches to identify the existence of the low side fault in a particular phase or particular low side semiconductor switch.

19. The method according to claim 18 further comprising:
if there is no short circuit identified for any high side semiconductor switch or any low side semiconductor switch, turning on the high side semiconductor switch and the low side semiconductor switch of a certain phase to diagnose a discontinuity or open failure state of the activated high side semiconductor switch or the activated low side semiconductor switch of the certain phase.

20. The method according to claim 19 further comprising:
testing each low side semiconductor switch and each high side semiconductor switch of the controller for a ground fault or short circuit prior to testing for the discontinuity or the open circuit in the low side semiconductor switch or the high side semiconductor switch.

21. The method according to claim 18 further comprising:
if no ground fault or short circuit of any semiconductor switch is established or detected, turning on a high side semiconductor switch on one phase and a low side semiconductor switch of another phase to identify a discontinuity or deficiency in at least one of the semiconductor switches of the controller or a short circuit of winding of a motor coupled to the controller.

22. The method according to claim 21 further comprising:
setting a maximum test current threshold lower than a maximum operational current threshold;
turning of the activated high side switch and the activated low side switch if current flow through one or more winding phases exceeds the maximum test current threshold.

23. The method according to claim 21 further comprising:
sequentially turning on pairs of a high side switch and of a low side switch of different phases until all combinations of the pairs are activated to identify any discontinuity of open failure state of the activated switches of the different phases.

24. The method according to claim 18 further comprising:
if a short is detected on a high side switch, turning on a low side switch and checking for a current fault;
triggering an expiration of a diagnostic timer if no fault is detected on the low side switch; and
indicating a phase in the high side switch with the current fault if the diagnostic timer is triggered.

* * * * *